(12) United States Patent
Cok

(10) Patent No.: US 6,831,407 B2
(45) Date of Patent: Dec. 14, 2004

(54) OLED DEVICE HAVING IMPROVED LIGHT OUTPUT

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 78 days.

(21) Appl. No.: 10/271,069

(22) Filed: Oct. 15, 2002

(65) Prior Publication Data

US 2004/0070335 A1 Apr. 15, 2004

(51) Int. Cl.⁷ ............................................... H05B 33/00
(52) U.S. Cl. ...................... 313/504; 313/506; 315/169.3
(58) Field of Search ............................... 313/498–512; 428/690, 917; 315/169.3, 169.1

(56) References Cited

U.S. PATENT DOCUMENTS

| | | | | |
|---|---|---|---|---|
| 4,356,429 A | * | 10/1982 | Tang | 313/503 |
| 4,539,507 A | * | 9/1985 | VanSlyke et al. | 313/504 |
| 4,774,435 A | * | 9/1988 | Levinson | 313/509 |
| 4,885,211 A | * | 12/1989 | Tang et al. | 428/457 |
| 5,059,861 A | * | 10/1991 | Littman et al. | 313/503 |
| 5,059,862 A | * | 10/1991 | VanSlyke et al. | 313/503 |
| 5,247,190 A | * | 9/1993 | Friend et al. | 257/40 |
| 5,294,870 A | * | 3/1994 | Tang et al. | 313/504 |
| 5,608,287 A | * | 3/1997 | Hung et al. | 313/503 |
| 5,677,572 A | * | 10/1997 | Hung et al. | 257/750 |
| 5,703,436 A | * | 12/1997 | Forrest et al. | 313/506 |
| 5,714,838 A | * | 2/1998 | Haight et al. | 313/506 |
| 5,739,545 A | * | 4/1998 | Guha et al. | 257/40 |
| 5,776,622 A | * | 7/1998 | Hung et al. | 428/690 |
| 5,776,623 A | * | 7/1998 | Hung et al. | 428/690 |
| 5,834,893 A | | 11/1998 | Bulovic et al. | |
| 5,837,391 A | * | 11/1998 | Utsugi | 428/690 |
| 5,851,709 A | * | 12/1998 | Grande et al. | 430/7 |
| 5,969,474 A | * | 10/1999 | Arai | 313/504 |
| 5,981,306 A | * | 11/1999 | Burrows et al. | 438/22 |
| 6,066,357 A | * | 5/2000 | Tang et al. | 427/66 |
| 6,091,195 A | | 7/2000 | Forrest et al. | |
| 6,137,223 A | * | 10/2000 | Hung et al. | 313/506 |
| 6,140,763 A | * | 10/2000 | Hung et al. | 313/503 |
| 6,172,459 B1 | * | 1/2001 | Hung et al. | 313/506 |
| 6,226,890 B1 | * | 5/2001 | Boroson et al. | 34/472 |
| 6,237,529 B1 | * | 5/2001 | Spahn | 118/726 |
| 6,278,236 B1 | * | 8/2001 | Madathil et al. | 313/504 |

(List continued on next page.)

FOREIGN PATENT DOCUMENTS

WO     WO 02/37568 A1    5/2002

OTHER PUBLICATIONS

Tsutsui et al., "Sharply directed emission in organic electroluminescent diodes with an optical–microcavity structure", *Applied Physics Letters*, 65 (15), Oct. 10, 1994, pp. 1868–1870.

Lupton et al., "Bragg scattering from periodically microstructured light emitting diodes", *Applied Physics Letters*, vol. 77, No. 21, Nov. 20, 2000, pp. 3340–3342.

Safonov et al., "Modification of polymer light emission by lateral microstructure", Elsevier Science B.V., *Synthetic Metals* 116 (2001), pp. 145–148.

*Primary Examiner*—Nimeshkumar D. Patel
*Assistant Examiner*—Karabi Guharay
(74) *Attorney, Agent, or Firm*—Andrew J. Anderson; Thomas H. Close

(57) ABSTRACT

An OLED device includes a substrate; an OLED having a first electrode formed over the substrate, a layer of organic light emitting material formed over the first electrode, and a second electrode formed over the layer of organic light emitting material to define a light emitting area, wherein the light emitted by the OLED experiences undesirable waveguiding in the device; and a topographical feature located within the light emitting area for disrupting the waveguiding, whereby the light emitting efficiency of the light emitting area is improved.

19 Claims, 5 Drawing Sheets

U.S. PATENT DOCUMENTS

| | | | |
|---|---|---|---|
| 6,396,208 B1 | * | 5/2002 | Oda et al. .................... 313/504 |
| 6,433,487 B1 | * | 8/2002 | Yamazaki ................ 315/169.3 |
| 6,476,550 B1 | * | 11/2002 | Oda et al. .................... 313/504 |
| 6,617,784 B1 | * | 9/2003 | Abe et al. .................... 313/506 |
| 6,630,684 B2 | * | 10/2003 | Lee et al. ..................... 257/40 |
| 6,670,772 B1 | * | 12/2003 | Arnold et al. ........... 315/169.3 |
| 2003/0117067 A1 | * | 6/2003 | Roitman et al. ............ 313/504 |
| 2004/0017152 A1 | * | 1/2004 | Hashimoto et al. ......... 313/505 |

* cited by examiner

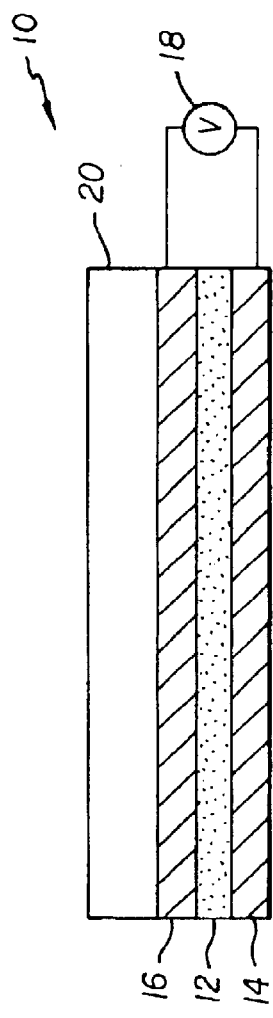
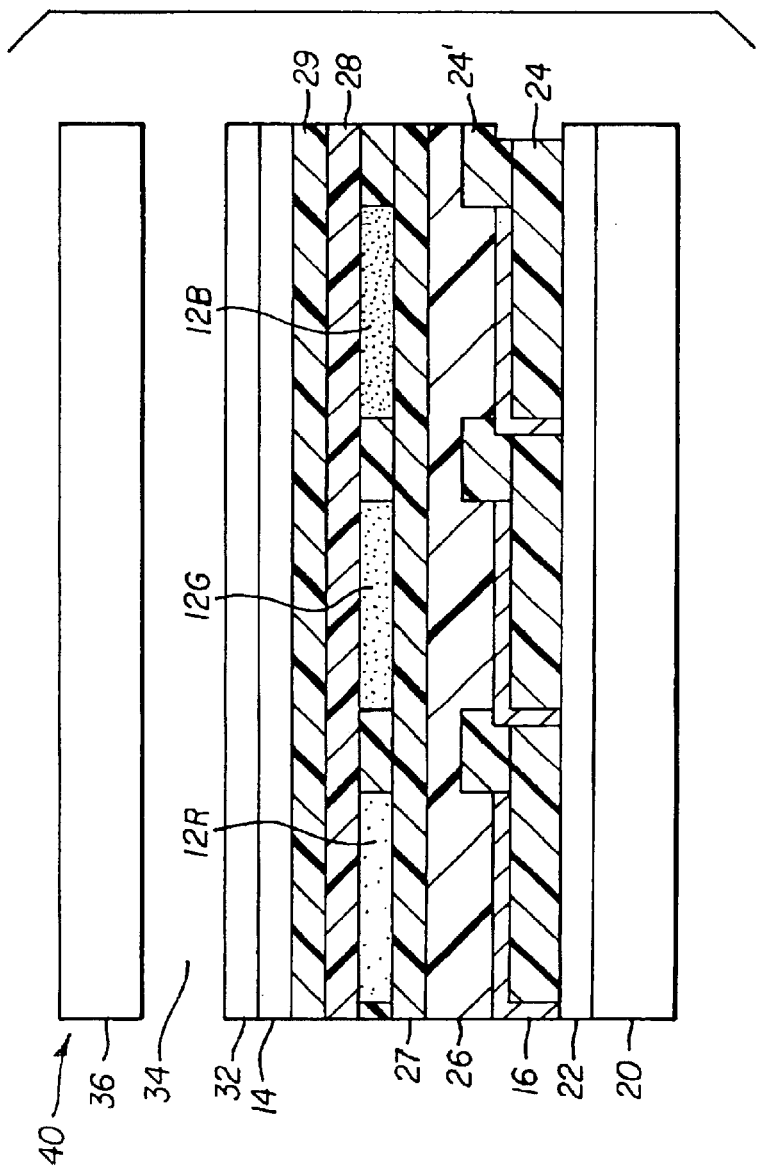

OLED DEVICE HAVING IMPROVED LIGHT OUTPUT

FIELD OF THE INVENTION

The present invention relates to organic light emitting diode (OLED) devices, and more particularly, to OLED device structures for improving light output.

BACKGROUND OF THE INVENTION

Organic light emitting diodes (OLED) are a promising technology for flat-panel displays and area illumination lamps. The technology relies upon thin film layers of materials coated upon a substrate. However, as is well known, much of the light output from the light-emissive layer in the OLED is absorbed within the device. Because the light emission from the OLED is Lambertian, light is emitted equally in all directions so that some of the light is emitted directly from the device, some is emitted into the device and is either reflected back out or is absorbed, and some of the light is emitted laterally and trapped and absorbed by the various layers comprising the device. In general, up to 80% of the light may be lost in this manner.

A variety of techniques have been proposed to improve the out-coupling of light from thin-film light emitting devices. For example, diffraction gratings have been proposed to control the attributes of light emission from thin polymer films by inducing Bragg scattering of light that is guided laterally through the emissive layers; see "Modification of polymer light emission by lateral microstructure" by Safonov et al., Synthetic Metals 116, 2001, pp. 145–148; and "Bragg scattering from periodically microstructured light emitting diodes" by Lupton et al., Applied Physics Letters, Vol. 77, No. 21, Nov. 20, 2000, pp. 3340–3342. Brightness enhancement films having diffractive properties and surface and volume diffusers are described in WO0237568 A1 entitled "Brightness and Contrast Enhancement of Direct View Emissive Displays" by Chou et al., published May 10, 2002.

The use of micro-cavities and scattering techniques is also known; for example, see "Sharply directed emission in organic electroluminescent diodes with an optical-microcavity structure" by Tsutsui et al., Applied Physics Letters 65, No. 15, Oct. 10, 1994, pp. 1868–1870. However, none of these approaches cause all, or nearly all, of the light produced to be emitted from the device.

Reflective structures surrounding a light emitting area or pixel are described in U.S. Pat. No. 5,834,893 issued Nov. 10, 1998 to Bulovic et al. and describes the use of angled or slanted reflective walls at the edge of each pixel. Similarly, Forrest et al. describe pixels with slanted walls in U.S. Pat. No. 6,091,195 issued Jul. 18, 2000. These approaches use reflectors located at the edges of the light emitting areas. However, considerable light is still lost through absorption of the light as it travels laterally through the layers parallel to the substrate within a single pixel or light emitting area.

There is a need therefore for an improved organic light emitting diode device structure that avoids the problems noted above and improves the efficiency of the device.

SUMMARY OF THE INVENTION

The need is met by providing an OLED device that includes a substrate; an OLED having a first electrode formed over the substrate, a layer of organic light emitting material formed over the first electrode, and a second electrode formed over the layer of organic light emitting material to define a light emitting area, wherein the light emitted by the OLED experiences undesirable waveguiding in the device; and a topographical feature located within the light emitting area for disrupting the waveguiding, whereby the light emitting efficiency of the light emitting area is improved.

ADVANTAGES

The present invention has the advantage that it increases the light output from an OLED device.

BRIEF DESCRIPTION OF THE DRAWINGS

FIG. 1 illustrates a partial cross section of a prior art conventional OLED;

FIG. 2 illustrates a partial cross section of a prior art conventional top-emitting OLED color display device;

Figure 3:
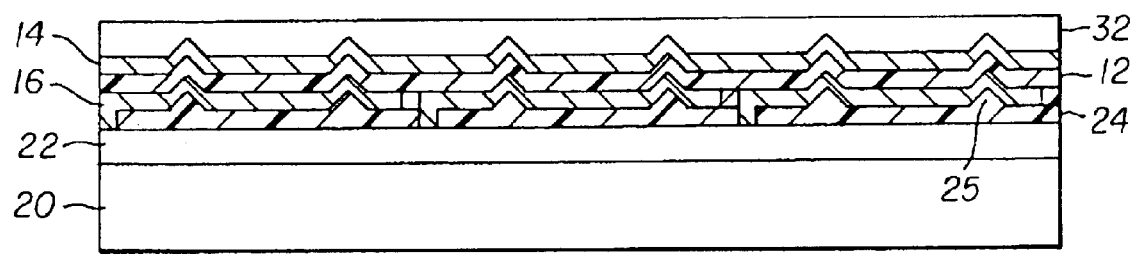
FIG. 3 is a partial cross section of a top-emitter OLED display device according to one embodiment of the present invention.

It will be understood that the figures are not to scale since the individual layers are too thin and the thickness differences of various layers too great to permit depiction to scale.

DETAILED DESCRIPTION OF THE INVENTION

Referring to FIG. 1, a prior art OLED 10 includes a light emitting layer 12 disposed between two electrodes 14 and 16, e.g. a cathode and an anode. The organic electroluminescent layer 12 emits light upon application of a voltage from a power source 18 across the electrodes. The OLED 10 typically includes a substrate 20 such as glass or plastic. It will be understood that the relative locations of the electrodes 14 and 16 may be reversed with respect to the substrate. The light emitting layer 12 may include other layers such as electron or hole injection layers as is known in the art. Such an OLED can be used in a display device having light emitting areas comprising individually addressable pixels to provide an image display, or in area illumination lamp having one or more light emitting areas.

Referring to FIG. 2, a prior art top-emitting active matrix OLED display device 40 includes a substrate 20, and a thin-film transistor (TFT) active matrix layer 22 comprising an array of TFTs that provides power to OLED elements. A patterned first insulating layer 24 is provided over the TFT active matrix layer, and an array of first electrodes 16 are provided over the planarized insulating layer 24 and in electrical contact with the TFT active matrix layer. A patterned second insulating layer 24' is provided over the array of first electrodes 16 such that at least a portion of the each of the first electrodes 16 is exposed.

Over the first electrodes and insulating layers are provided red, green, and blue-emitting organic OLED materials, 12R, 12G, and 12B, respectively. These elements are composed of further layers as described in more detail below. Herein, the collection of OLED elements, including hole injection 26, hole transport 27, electron injection 29, and electron transport layers 28, may also be referred to as the light emitting layer 12. The light-emitting area is generally defined by the area of the first electrode 16 in contact with the OLED elements. Over the light emitting layer 12 is provided a transparent, common second electrode 14 that has sufficient optical transparency to allow transmission of the generated red, green, and blue light. An optional second electrode protection layer 32 may be provided to protect the electrode and underlying layers. Each first electrode in combination with its associated OLED element and second electrode is herein referred to as an OLED. A typical top-emitting OLED display device comprises an array of OLEDs wherein each OLED emits red, green or blue. A gap 34 generally filled with inert gas or a transmissive polymer material separates the electrode protection layer from an encapsulating cover 36. The encapsulating cover 36 may also be a layer deposited directly on the common second electrode 14 or the optional second electrode protection layer 32.

In operation, the thin-film transistors in TFT layer 22 control current between the first electrodes 16, each of which can be selectively addressed, and the common second electrode 14. Holes and electrons recombine within the OLED elements to emit light from the light emitting elements 12. Because the layers are so thin, typically several hundred angstroms, they are largely transparent.

Figure 4:
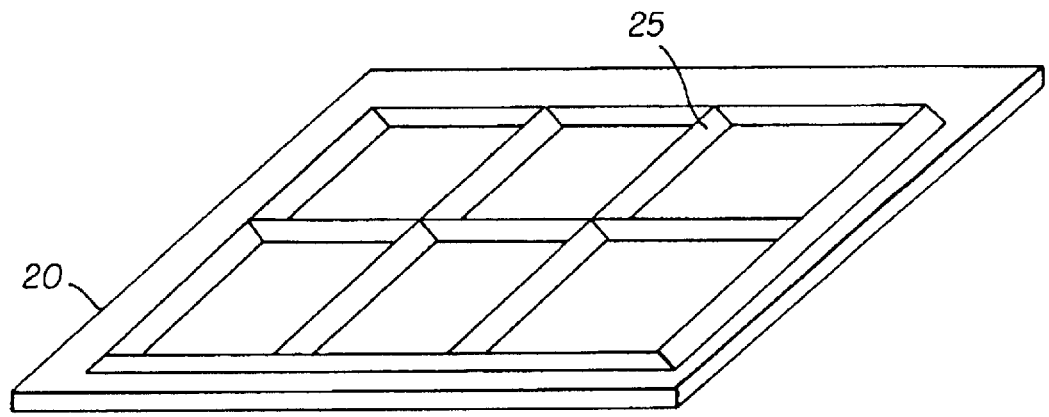
FIG. 4 is a top perspective view of a light emitting area of an OLED device according to one embodiment of the present invention.

Referring to FIG. 3, a top-emitter active matrix display device according to one embodiment of the present invention includes a substrate 20, TFT layer 22, an insulating layer 24, and first electrode 16. Conventional light emitting layers 12 are deposited upon the electrodes 16 and insulating layer 24. A second, common electrode 14 and protection layer 32 are deposited above the light emitting layers 12. The device is encapsulated conventionally with an encapsulating cover or layer (not shown). The insulating layer 24 includes a topographical feature 25 located within the light emitting areas (in this example the pixels) of the device. The topographical feature 25 comprises, for example, a plurality of ridges arranged within the light emitting area of the device and preferably having sides that slope at 45 degrees from the perpendicular to the plane of the device (that is at an angle of substantially 135 degrees from the substrate surface) and preferably distributed in a grid pattern as shown in FIG. 4.

Figure 3A:
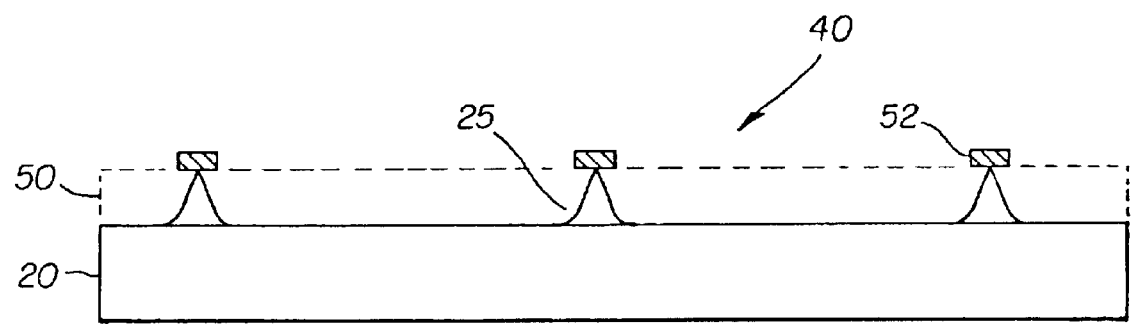
FIG. 3a is schematic diagram used in describing one method forming wave-guide-disrupting topographical features according to one embodiment of the present invention.

The geometry of the topographical features is designed to be effective to disrupt the waveguiding in the layers of electrodes 16 and 14 and/or light emitting layer 12. The layers 12, 14, and 16 together have a typical thickness of 0.2 or 0.3 microns and, preferably, the topographical features have a height of 0.5 micron or more. Conventional lithographic means can be used to create the topographical features using, for example, photo-resist, mask exposures, and etching as described in detail in the referenced patents. For example, as shown in FIG. 3a using known photolithographic processes, a patterned layer of silicon dioxide 50 can be formed on the device 40. A line pattern 52 of photo-resist is formed on the silicon dioxide layer 50 to define the location of the top of each ridge 25. An etching process is employed to create the topographical features in the layer of silicon dioxide. The photo-resist pattern 52 is then removed and the electrodes and light emitting layers are deposited over the silicon dioxide. The subsequently deposited layers conform to the topographical features 25.

The spacing of the topographical features 25 within the light-emitting area may be adjusted depending on the absorption of waveguided light by the electrodes 14, 16, and the organic materials 12. For example, the blue light may be absorbed most readily, hence the frequency of ridges can be higher in blue emitting areas to ensure that the light is emitted from the light piping layers before they are absorbed. Generally, the topographical features should be spaced at between 2 and 100 microns apart to avoid diffraction effects and a consequent frequency related angular variation of emission.

Figure 4A:
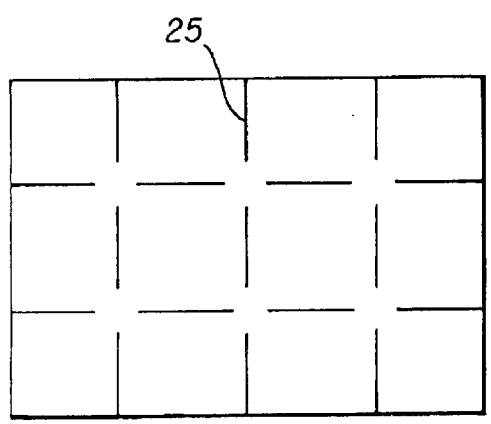
FIGS. 4a and b are diagrams showing how a grid of topographical features not continuous according to one embodiment of the invention.
Figure 4B:
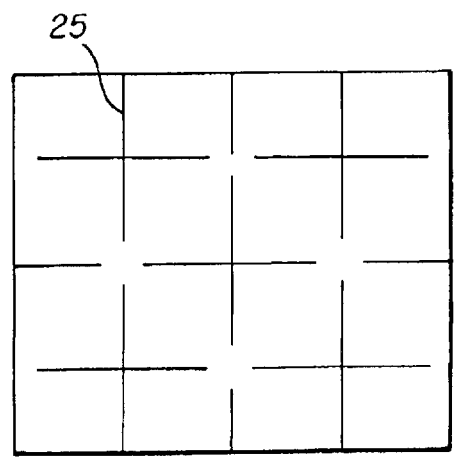

The arrangement of the topographical features may also be adjusted in period and in shape. FIG. 4 illustrates a two-dimensional rectangular grid. A hexagonal arrangement, for example, may be used and has advantages in that a greater area may be surrounded with fewer topographical features. Alternatively, the topographical features need not be completely contiguous as illustrated in FIGS. 4a and 4b.

One problem that may be encountered with such topographical features is that the electrodes may tend to fail open at sharp edges associated with the features. Referring to FIGS. 4a and 4b the topographical features 25 may be periodically interrupted to insure the electrodes are electrically continuous in the light emitting area.

The topographical feature 25 is large enough to maintain its shape as the subsequent layers of electrode 16, light emitting material 12, and electrode 14 are deposited. It is not necessary that the top surface of the top electrode layer 14 maintain the shape of the topographical feature. Hence, the electrode layer 14 might be thicker than the other layers and may also function as a planarizing layer in the device.

In operation, the OLED materials and electrodes act conventionally to emit light. A portion of the light is emitted directly out of the device, some is reflected from the electrode or planarization layer 24, and a portion is waveguided laterally. The layers 12, 14, and 16 act as a wave-guide to conduct the light along the surface of the device. When the light meets the topographical feature 25, it is reflected or refracted out of the device. Essentially, the topographical feature 25 causes the layers 12, 14, and 16 to perform as a leaky wave-guide.

Typically, the pixels in an OLED display device are rectangular and have edges of 50–200 microns. In a simple case, for example, a 50 micron by 200 micron light-emitting area might be divided into two subsections by a single topographical feature placed across the light emitting area and dividing it into two 50 micron by 100 micron areas. In a more complex case, the light-emitting area might be divided into four equal areas of 50 microns square.

The more closely spaced the topographical features are, the less light will be absorbed as the light propagates through the wave-guiding material. However, the light emitted from the materials deposited on the faces of the reflecting structures is not emitted in the same direction as that of the remainder of the light emitting area. Therefore, there may be a tradeoff between the frequency of the topographical features and the amount of light emitted orthogonally to the surface of the display. Moreover, the topographical features should not be placed so frequently as to create a diffractive effect since such a diffractive effect will create an angular dependence on the frequency of the light emitted. Generally, a period greater than 2 microns is adequate. Positioning the structures so that the period is variable and the structures are not parallel will also prevent this effect.

Figure 5:
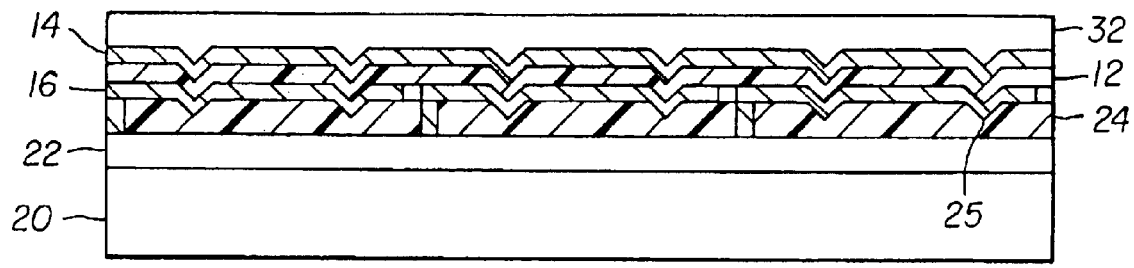
FIG. 5 is a partial cross sectional view of a display device according to an alternative embodiment of the present invention.
Figure 6:
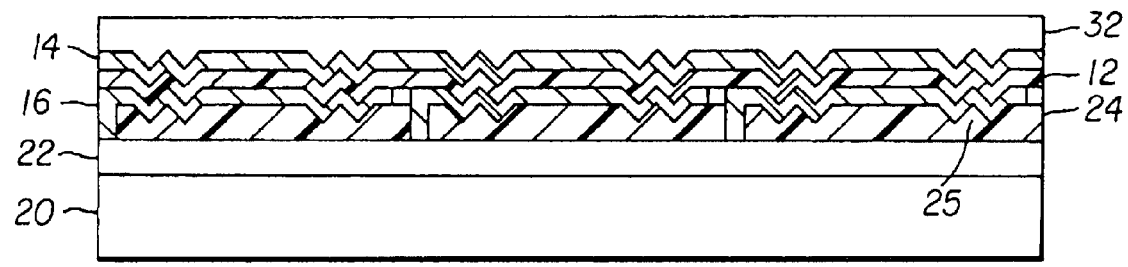
FIG. 6 is a partial cross sectional view of a display device according to a further alternative embodiment of the present invention.

A variety of topographical features can be created and are dependent on the capabilities of the process. For example, the topographical features shown in FIG. 3 are generated by etching an insulating layer. Alternatively, the topographical features can be valleys as shown in FIG. 5, or a local ridge within a valley as shown in FIG. 6. The topographical features described above all have generally triangular cross sections having sides that are disposed at 45 degrees to the plane of the substrate. Other cross sections and angular arrangements are possible, for example, ridges or valleys having curved sides can be employed in the present invention. The topographical feature may be provided with a rounded top to reduce the possibility of shorts between the electrodes.

Figure 7:
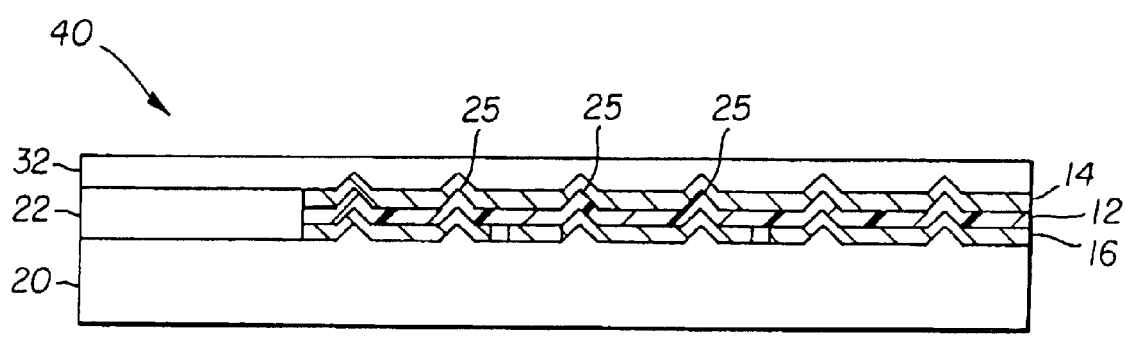
FIG. 7 is a partial cross sectional view of a bottom-emitter OLED display according to one embodiment of the present invention.

Referring to FIG. 7, a bottom-emitter embodiment of the present invention, wherein the TFT layers may be arranged beside, rather than under the light emitting areas, includes a substrate 20, TFT layer 22, and first electrode 16 separated by insulators or simply by a gap. Conventional light emitting layers 12 are deposited upon the electrodes 16. A second, common electrode 14 and optional protection layer 32 are deposited above the light emitting layers 12. The device is encapsulated conventionally with an encapsulating cover or layer (not shown). The substrate 20 includes topographical features 25 spaced over the surface of the light emitting area. The topographical features are large enough to interrupt light that is waveguided through the conventional layers of electrodes 16 and 14 and organic materials 12. The arrangements, sizes, shapes, compositions, and patterns described above for the top-emitter embodiment are equally applicable in a bottom-emitter embodiment. Note that it is not necessary that the topographical features 25 be created from or directly on the substrate 20. Alternative layers, such as the insulating layer 24 of the top-emitter embodiment or electrode 16 may be used to form the necessary structures (not shown).

Figure 8:
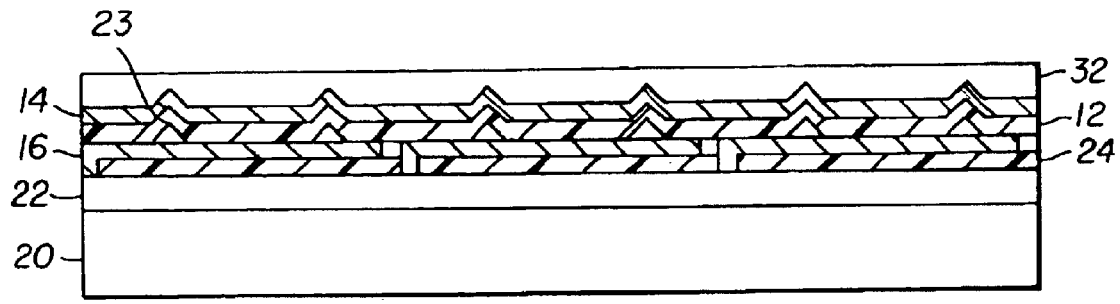
FIG. 8 is a partial cross sectional view of a bottom-emitter OLED display according to a further embodiment of the present invention.

Referring to FIG. 8, to avoid the problem of electrical opens within the first electrode 16 the topographical feature 23 is formed on top of, rather than under, the first electrode 16. The organic layer(s) 12 and second electrode 14 are deposited conformally over the topographical feature 23. This arrangement can be employed in either a top or bottom emitter configuration.

The present invention may also be practiced with passive-matrix OLED devices, i.e. devices without TFT devices associated with each pixel. In this simpler embodiment, the topographical features are distributed over the light emitting area as in the bottom emitter embodiment, without regard to local TFT devices. Reference has been made above to the application of the present invention to OLED display devices. The present invention is applicable to other OLED device applications, for example area illumination devices that may not include any thin-film transistor structures or pixellated display elements.

Details of the OLED materials, layers, and architecture are described in more detail below.

General Device Architecture

The present invention can be employed in most OLED device configurations. These include very simple structures for area illumination comprising a single anode and cathode to more complex devices, such as passive matrix displays comprised of orthogonal arrays of anodes and cathodes to form pixels, and active-matrix displays where each pixel is controlled independently, for example, with a thin film transistor (TFT).

Figure 9:
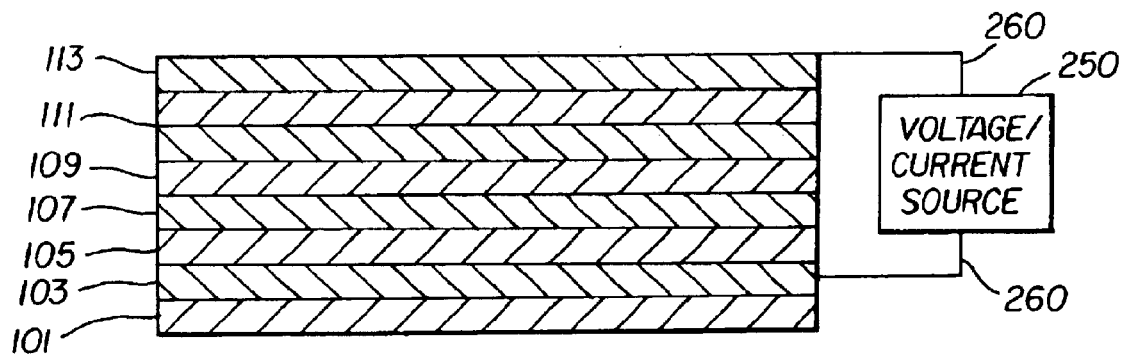
FIG. 9 is a partial cross section of a prior art OLED emitter having multiple layers.

There are numerous configurations of the organic layers wherein the present invention can be successfully practiced. A typical structure is shown in FIG. 9 and is comprised of an anode layer 103, a hole-injecting layer 105, a hole-transporting layer 107, a light-emitting layer 109, an electron-transporting layer 111, and a cathode layer 113. These layers are described in detail below. Note that the substrate may be located adjacent to the cathode, or the substrate may actually constitute the anode or cathode. The organic layers between the anode and cathode are conveniently referred to as the organic electroluminescent (EL) element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate 101, which as previously described, may also comprise other layers such as TFT electronics and insulating layers. The electrode provided over the substrate is conveniently referred to as the bottom electrode. Conventionally, the bottom electrode is the anode, but this invention is not limited to that configuration. The substrate can either be light transmissive or opaque, depending on the intended direction of light emission. The light transmissive property is desirable for EL emission through the substrate. Transparent glass or plastic is commonly employed in such cases. For applications where the EL emission is through the top electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

Anode

When EL emission is through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where the anode is reflective, conductors may include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photo-lithographic processes.

Hole-Injecting Layer (HIL)

It is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,769,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc(II)
CO-4: Bis(2-methyl-8-quinolinolato)aluminum(III)-μ-oxo-bis(2-methyl-8-quinolinolato)aluminum(III)

CO-5: Indium trisoxine [alias, tris(8-quinolinolato) indium]

CO-6: Aluminum tris(5-methyloxine) [alias, tris(5-methyl-8-quinolinolato)aluminum(III)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato) zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 111 and 109 can optionally be collapsed into a single layer that serves the function of supporting both light emission and electron transport. These layers can be collapsed in both small molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Cathode

When light emission is solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, and U.S. Pat. No. 6,278,236. Cathode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and antiglare or anti-reflection coatings may be specifically provided over the cover or as part of the cover.

The invention has been described in detail with particular reference to certain preferred embodiments thereof, but it will be understood that variations and modifications can be effected within the spirit and scope of the invention.

PARTS LIST

10 OLED
12 light emitting layer
12R red-light emitting OLED materials
12G green-light emitting OLED materials
12B blue-light emitting OLED materials
14 second electrode layer
16 first electrode layer
18 power source
20 substrate
22 TFT layer
24 insulating layer
24' second insulating layer
25 topographical feature
26 hole-injecting layer
27 hole-transporting layer
28 electron transporting layer
29 electron injection layer
32 electrode protection layer
34 gap
36 encapsulating cover
40 OLED display
50 silicon dioxide layer
52 photo-resist pattern
101 substrate
103 anode layer
105 hole-injecting layer
107 hole-transporting layer
109 light-emitting layer
111 electron-transporting layer
113 cathode layer
250 voltage/current source
260 conductive wiring

What is claimed is:

1. An OLED device, comprising:
   a) a substrate;
   b) an OLED having a first electrode formed over the substrate, a layer of organic light emitting material formed over the first electrode, and a second electrode formed over the layer of organic light emitting material to define a light emitting area, wherein the light emitted by the OLED experiences undesirable waveguiding in the device; and
   c) a topographical feature located within the light emitting area for disrupting the waveguiding, where the topographical feature is spaced by a period of greater than 2 microns from any other topographical feature located within the light emitting area, whereby the light emitting efficiency of the light emitting area is improved and creation of a diffractive effect is avoided.

2. The OLED device claimed in claim 1, wherein the OLED device is a display device having a plurality of individually addressable light emitting pixels and the light emitting area is a single pixel.

3. The OLED device claimed in claim 2, wherein the display is a color display having differently colored pixels.

4. The OLED device claimed in claim 3, wherein the topographical feature has a structure that is dependent on the color of the pixel.

5. The OLED device claimed in claim 4, wherein the structure is periodic and the period of the structure is dependent on the color of the pixel.

6. The OLED device claimed in claim 1, wherein the OLED device is an area illumination lamp having one or more light emitting areas.

7. The OLED device claimed in claim 1, wherein the topographical feature is defined by a feature in the substrate.

8. The OLED device claimed in claim 1, wherein the substrate and first electrode are flat in the OLED light emitting area, and the topographical feature is defined by a feature in an insulating layer located under the light emitting layer.

9. The OLED device claimed in claim 1, wherein the topographical feature is defined by a feature in the first electrode.

10. The OLED device claimed in claim 1, wherein the topographical feature is a ridge or valley.

11. The OLED device claimed in claim 1, wherein the topographical feature is a ridge in a valley.

12. The OLED device claimed in claim 1, wherein the topographical feature has a triangular cross section.

13. The OLED device claimed in claim 12, wherein the triangular cross section has sides arranged at 45 degrees to the substrate.

14. The OLED device claimed in claim 1, wherein the light emitting layer is generally planar and further comprising a reflective surface on an edge of the topographical feature.

15. The OLED device claimed in claim 1, wherein the topographical feature includes a material having a refractive index different from the light emitting layer.

16. The OLED device claimed in claim 1, wherein the topographical feature forms a rectangular or hexagonal grid within the light emitting area.

17. The OLED device claimed in claim 16, wherein the grid is not continuous over the light emitting area.

18. The OLED device claimed in claim 1, wherein the second electrode has one side in contact with the light emitting layer that conforms to the topographical feature and an opposite side that is substantially flatter.

19. The OLED device claimed in claim 1, further comprising means surrounding the light emitting area for disrupting the waveguiding.

* * * * *